United States Patent
Nishida et al.

(10) Patent No.: US 6,592,810 B2
(45) Date of Patent: Jul. 15, 2003

(54) FE-NI ALLOY HAVING HIGH STRENGTH AND LOW THERMAL EXPANSION, A SHADOW MASK MADE OF THE ALLOY, A BRAUN TUBE WITH THE SHADOW MASK, A LEAD FRAME MADE OF THE ALLOY AND A SEMICONDUCTOR ELEMENT WITH LEAD FRAME

(75) Inventors: Junichi Nishida, Yasugi (JP); Ryoji Inoue, Yonago (JP); Takehisa Seo, Yonago (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/810,176

(22) Filed: Mar. 19, 2001

(65) Prior Publication Data

US 2002/0006350 A1 Jan. 17, 2002

(30) Foreign Application Priority Data

Mar. 17, 2000 (JP) ........................................ 2000-076563
Apr. 21, 2000 (JP) ........................................ 2000-120302

(51) Int. Cl.$^7$ ......................... C22C 38/08; C22C 30/00; C22C 19/03
(52) U.S. Cl. ......................... 420/94; 420/95; 420/581; 420/459; 148/336; 148/409; 148/419; 313/402
(58) Field of Search ........................... 420/94, 95, 581, 420/459; 148/336, 419; 313/402; 318/405

(56) References Cited

U.S. PATENT DOCUMENTS

| | | | |
|---|---|---|---|
| 3,647,426 A | * 3/1972 | Wache ......................... | 420/94 |
| 5,792,286 A | 8/1998 | Inoue et al. | |
| 5,997,807 A | 12/1999 | Kuboi | |

FOREIGN PATENT DOCUMENTS

| | | | |
|---|---|---|---|
| EP | 0 489 932 A1 | 6/1992 | |
| JP | 61-276950 A | 12/1986 | |
| JP | 4-120251 | 4/1992 | ........... C22C/38/00 |
| JP | 5-271877 | 10/1993 | ........... C22C/38/00 |
| JP | 7-102345 A | 4/1995 | |
| JP | 07-138705 | 5/1995 | |
| JP | 7-145451 | 6/1995 | ........... C22C/38/00 |
| JP | 8-269645 A | 10/1996 | |
| JP | 9-263891 A | 10/1997 | |
| JP | 9-263891 | 10/1997 | ........... C22C/38/00 |
| JP | 10-60528 | 3/1998 | ............. C21C/8/02 |
| JP | 10-183304 | 7/1998 | ........... C22C/38/00 |
| JP | 2000-017394 | 1/2000 | |

OTHER PUBLICATIONS

European Search Report for EO 01 10 6170 dated April 8, 2002.
Patent Abstracts of Japan 07–145451, Jun. 6, 1995.
Patent Abstracts of Japan 09–263891, Oct. 7, 1997.
Patent Abstracts of Japan 10–183304, Jul. 14, 1998.
Patent Abstracts of Japan 10–060528, Mar. 3, 1998.
Patent Abstracts of Japan 05–271877, Oct. 19, 1993.

* cited by examiner

*Primary Examiner*—Deborah Yee
(74) *Attorney, Agent, or Firm*—Sughrue Mion, PLLC

(57) ABSTRACT

Disclosed is an Fe—Ni alloy consisting of, by mass, 30 to 50% of Ni (or 27 to 47% Ni and not more than 22% Co), 0.005 to 0.1% of Nb, less than 0.01% of C, 0.002 to 0.02% of N, and the balance of Fe and inevitable impurities, wherein the equation "$0.000013 \leq (\% \text{Nb}) \times (\% \text{N}) \leq 0.002$", is fulfilled. In the alloy, preferably, the maximum grain size of compounds primarily containing Nb and nitrogen and other compounds primarily containing Nb and C is less than 0.5 μm, which can be observed at an fractional section of metal structure, and a total number of the compounds is not less than 50,000/mm$^2$ at an fractional section. An average grain size of the alloy structure is not less than 10 by the crystal grain size number as defined in JIS G0551. The alloy may applied to shadow masks for the Braun tube and lead frames for semiconductor elements.

21 Claims, 1 Drawing Sheet

1.5 μm

FE-NI ALLOY HAVING HIGH STRENGTH AND LOW THERMAL EXPANSION, A SHADOW MASK MADE OF THE ALLOY, A BRAUN TUBE WITH THE SHADOW MASK, A LEAD FRAME MADE OF THE ALLOY AND A SEMICONDUCTOR ELEMENT WITH LEAD FRAME

BACKGROUND OF THE INVENTION

The present invention relates to an Fe—Ni alloy having high strength and a small average thermal expansion coefficient. More particularly, it relates to an Fe—Ni alloy which is applied to a shadow mask, a Braun tube (i.e. cathode-ray tube) with the shadow mask, a lead frame, a semiconductor element with the lead frame, components of a precision machine and so on.

Fe—Ni alloys of the Invar alloy system, of which typical example is an Fe—36% Ni alloy, and Fe—Ni—Co alloys of the super Invar alloy system, of which typical example is an Fe—31% Ni—5% Co have been well known as low thermal expansion alloys each having a small thermal expansion coefficient. The Fe—Ni alloys and Fe—Ni—Co alloys have been utilized for the uses which require low thermal expansion property and which are, for example, shadow masks in displays of televisions and computers, electron gun electrodes of Braun tube, or lead frames used typically for semiconductor packages.

For example, mild steel has been conventionally used as the material of the shadow masks. Although mild steel has good press-deformability and etching property, it has a large thermal expansion coefficient of about $12 \times 10^{-6}/°$ C., so that it has a problem that a thermal expansion of mild steel by heating with electron beam irradiation causes deterioration of color purity. Recently, while there has been an increasing demand for displays with high resolution and high brightness, the Invar system alloys each having a small thermal expansion coefficient, typically the Fe—36% Ni alloy, have been put into practical use as an alternative shadow mask material to conventional mild steel. However, the Fe—36% Ni alloy of the Invar system has problems that it has inferior etching property than mild steel and is very expensive.

Furthermore, under a recent rapid progress of displays toward a flat-face configuration, a tensioning system, in which a shadow mask is supported by a mask frame under a tension, has been increasingly utilized instead of the conventional shadow mask produced by press forming. In the tensioning system, since the shadow mask is supported by the frame, it is not required to have particular strength for keeping its shape. Thus, a development of a thinner shadow mask is in progress for a cost reduction purpose. However, with regard to the handling of such a thin sheet, a handling property (i.e. strength) is required therefor so as to be able to bear bending and deformation at each handling step.

With regard to the lead frame, since it is bonded to a semiconductor element having a small thermal expansion coefficient, an Fe—Ni alloy, of which typical example is an Fe—42% Ni alloy having a thermal expansion coefficient close to that of the semiconductor element, is used for the lead frame material. The lead frame material is subjected to fine lead working of press-punching or photo-etching. Since there is an increasing demand for finely worked shapes of high precision as semiconductor devices become highly integrated, the Fe—Ni alloys is required to have improved punching property and enhanced strength for a thinner sheet.

With regard to the Fe—Ni and Fe—Ni—Co alloys applied to the above mentioned uses, there have been proposed many means by adding Nb for improving etching property, press-deformability, strength and punching property. For example, JP-A-4-120251 proposes a shadow mask material in which an amount of soluble nitrogen (N) is reduced by limiting nitrogen to not more than 0.01%, by adding 0.01 to 1.0% of Nb which is susceptible to form nitrides, and further by adding a proper amount of Cr to improve adhesion property of a resist film and rigidity after press-deforming. JP-A-7-145451 proposes a lead frame material in which 1 to 4% of Nb is added to obtain high strength.

With regard to lead frame materials, JP-A-9-263891 proposes an Fe—Ni alloy having high strength, low thermal expansion property and improved punching property, which comprises 0.003 to 0.03% of carbon, 0.005 to 2.5% of Nb, 0.001 to 0.02% of nitrogen and in which the alloy comprises niobium compounds (i.e. carbides and nitrides) having a particle size of not more than 20 $\mu$m. JP-A-10-183304 proposes a method for improving press-deformability and mechanical strength of an Fe—Ni alloy by controlling the size of particulate precipitates of elements, carbides, nitrides and/or intermetallic compounds which comprises elements of Group 4A or 5A to not more than 5 $\mu$m, and by further controlling carbon and Nb amounts within ranges of 0.001 to 0.3% and 0.01 to 6%, respectively, to control precipitation of NbC (niobium carbide).

Further, JP-A-10-60528 proposes a high strength Invar alloy sheet for shadow masks and lead frames, which comprises up to 0.10% of C, up to 1.0% of Nb and not more than 0.005% of nitrogen.

The alloys or ideas mentioned above are effective means for improving various properties required to shadow masks or lead frames. However, in the case of the way wherein, with use of soluble Nb as a highly strengthening means for the alloy, a work strain is provided to the alloy in order to work-harden it, a lot of Nb is required, so that there arises a concern about deterioration of thermal expansion property. Further, in the case where the alloy is highly-strengthened with use of Nb-containing precipitates, which relies on the dispersion-strengthening effect primarily by niobium carbide, a lot of Nb is also required to ensure an enough amount of precipitates for attaining such an effect. It is also noted that the precipitates have a large size.

In the conventional alloys mentioned above, carbides and nitrides, which crystallize during solidification after ingot-molding, are liable to be coarse, causing problems that they may protrude from an etched surface and wear of a die is enhanced when press-punching.

BRIEF SUMMARY OF THE INVENTION

Accordingly, an object of the invention is to provide an Fe—Ni alloy having high strength and a small average thermal expansion coefficient, in which crystallization of coarse carbides and nitrides is restrained.

Another object of the invention is to provide a shadow mask made of the Fe—Ni alloy and a Braun tube with the shadow mask.

Still another object of the invention is to provide a lead frame and a semiconductor element with the lead frame.

The present inventors tried to develop a new process for highly strengthening the Fe—Ni alloy without relying on crystallized carbides which are liable to be coarse. As a result, they have finally found that the alloy can be refined to have fine crystal grains by precipitating, in the alloy structure, a lot of fine niobium compounds, which are primarily niobium nitrides and other compounds such as nitrides, carbides, and carbon nitrides, the niobium nitrides being capable to be super-finely precipitated by the solution/precipitation treatment, thereby the alloy can be highly-strengthened effectively without deterioration of various material properties. That is, the manner of improving the Fe—Ni alloy is to precipitate super-fine niobium compounds with utilization of a small amount of additive Nb, more particularly, by adjusting each amount of Nb, carbon and nitrogen within an amount range entirely soluble in the Fe—Ni alloy by the solution treatment. According to the improving manner, it is unnecessary to use a large amount of Nb, because it is intended to restrain crystallization of coarse carbides and nitrides and does not rely on the conventional method which is primarily based on dispersion strengthening.

Thus, according to a first aspect of the invention, there is provided an Fe—Ni alloy having high strength and low thermal expansion, consisting essentially of, by mass percent, 30 to 50% of Ni, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002.$$

According to a second aspect of the invention, there is provided an Fe—Ni alloy having high strength and low thermal expansion, consisting essentially of, by mass percent, 27 to 47% of Ni, not more than 22% of Co, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002.$$

In the Fe—Ni alloy, preferably, the maximum grain size of compounds primarily comprising Nb and nitrogen and other compounds primarily comprising Nb and carbon is less than 0.5 $\mu$m, which can be observed at an fractional section of metal structure, and a total number of the compounds is not less than 50,000/mm² at an fractional section of metal structure.

Another preferable embodiment is that an average grain size of the metal structure of the Fe—Ni alloy is not less than 10 by the crystal grain size number as defined in JIS G0551. The Fe—Ni alloy may comprise not more than 0.10% of Mn and/or not more than 0.004% of B (boron).

According to a third aspect, the invention is directed to a shadow mask, which is made of the Fe—Ni alloy and can be provided by working so as to have highly fine and precise form, and a Braun tube which has the shadow mask and an excellent color purity.

According to a fourth aspect, the invention is directed to a lead frame being made of the Fe—Ni alloy and a semiconductor element which has the lead frame and can be highly integrated.

DETAILED DESCRIPTION OF THE INVENTION

Figure 1:
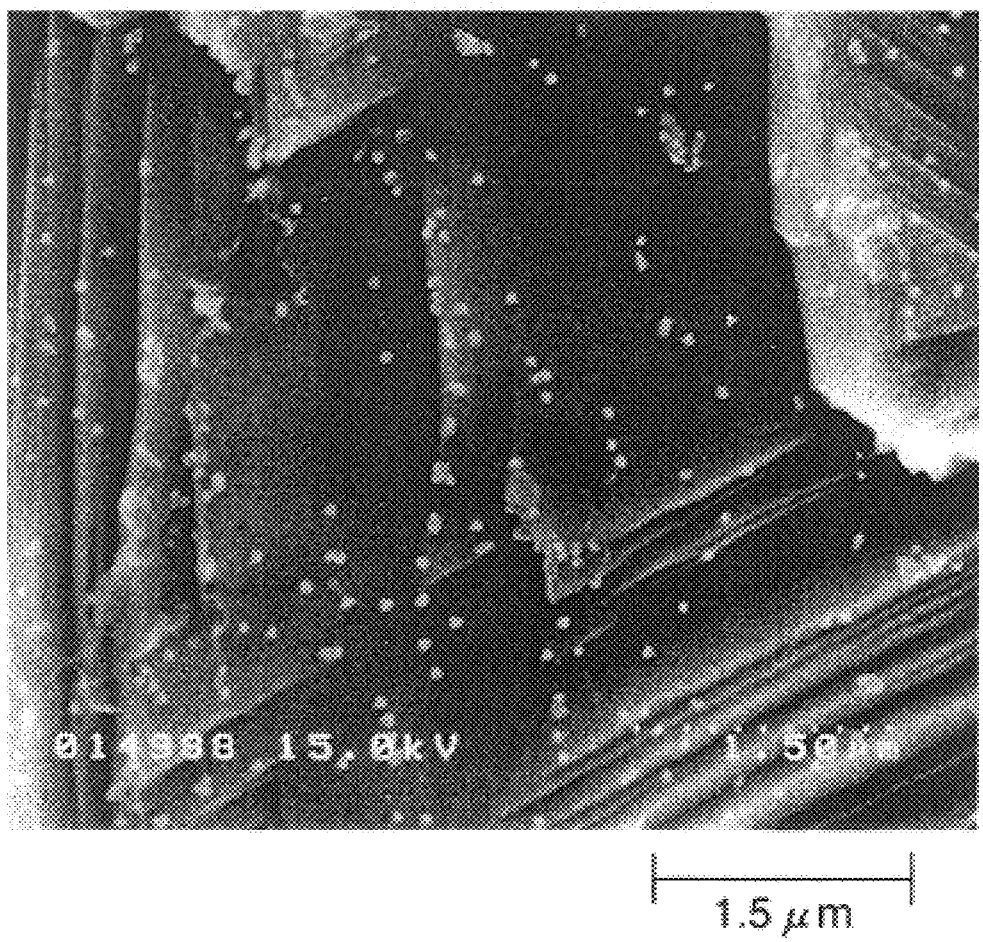
FIG. 1 is a micro-photograph exhibiting a fractional structural surface of the Fe—Ni alloy.

A key aspect of the invention is that, while restraining crystallization of coarse carbides and nitrides, the Fe—Ni alloy is highly-strengthened primarily based on dispersion strengthening without relying on the conventional method.

As aforementioned, the present inventors tried to develop a new process for solving the above problems caused by crystallization of coarse niobium carbides. The solution to solve the problems is to further adjust compounds primarily comprising Nb and nitrogen, and other compounds primarily comprising Nb and carbon, such as nitrides, carbides and carbon nitrides all of which have been used also for dispersion strengthening and which are referred to as "niobium compounds". In other words, the inventors directed their attention to that fine niobium compounds can be precipitated by the solution/precipitation treatment and to the effects of amounts of Nb, carbon and nitrogen by adjusting each amount of Nb, carbon and nitrogen within an amount range entirely soluble in the Fe—Ni alloy by the solution treatment.

The solubility product of niobium nitrides is smaller than that of carbides. Thus, an extremely small amount of Nb is used in order to entirely dissolve niobium nitrides in the alloy. Preferably, by making the solubility product of niobium nitrides within a range of from not less than 0.000013 to not more than 0.002, it becomes possible to dissolve the niobium nitrides within a temperature range of 900° C. to 1350° C., more preferably up to 1300° C. by the solution treatment. The niobium nitrides can be finely precipitated by subsequent precipitation treatment or controlled cooling after hot working.

Since ultra-fine precipitates act effectively as pinning particles for crystal grain boundaries, it is possible to make crystal grains super-fine to highly-strengthen the alloy. Thus, according to the Fe—Ni alloy, it is possible to form a lot of ultra-fine niobium compounds, especially niobium nitrides, therein to obtain high-strength without coarse carbides.

Below are the reasons why the defined amounts of alloying elements of the invention Fe—Ni alloy are preferred.

Ni is an element which influences the low thermal expansion property of the Fe—Ni or Fe—Ni—Co alloy. When the amount of Ni is lower than 30% or exceeds 50%, the alloy loses the Inver effect of lowering the thermal expansion coefficient, so that the Ni amount is set to the range of from 30% to 50%. In the invention Fe—Ni alloy, a part of Ni may be replaced with Co, or the invention Fe—Ni alloy may further comprise Co. Specifically, the invention Fe—Ni alloy may comprise 27 to 47% of Ni and not more than 22%, preferably 2 to 6%, of Co.

Nb is an important and indispensable element to the invention alloy. In the invention alloy, niobium compounds, especially niobium nitrides, can be super-finely precipitated by a extremely small amount of Nb to refine crystal grains. The lower limit of the Nb amount is 0.005% which is enough for refining crystal grains. On the other hand, when the Nb amount exceeds 0.1%, coarse niobium nitrides are liable to crystallize and hard to dissolve into the solid solution even by soaking treatment at a temperature higher than 1350° C., so that the upper limit is set to 0.1%. A preferable range of Nb is 0.01 to 0.05%.

C (carbon) is an element of which control is important for achieving the invention. When the carbon amount is too much, coarse niobium carbides are crystallized and niobium nitrides effective for refining crystal grains decrease, so that the carbon amount is set to less than 0.01%, preferably not more than 0.005%.

N (nitrogen) is also an important element to the invention together with Nb and carbon. It is needed to be not less than 0.002% in order to precipitate ultra-fine niobium compounds. However, a too much amount of nitrogen is liable to cause coarse niobium nitrides to crystallize and make the solvus temperature of soaking treatment higher, so that the upper limit is set to 0.02%. A preferable range of nitrogen is 0.003 to 0.01%.

In order to obtain ultra-fine niobium compounds, for example, it is effective to dissolve niobium nitrides once into the matrix by soaking treatment at 900° C. to 1350° C. Thus, in the invention, the solubility product of, by mass percent, (% Nb)×(% N) is set to 0.000013 to 0.002, more preferably 0.000013 to 0.001.

Further, while Mn is an element which improves hot workability of the alloy, it is possible to lower the thermal expansion coefficient of the Fe—Ni alloy by reduce its amount. In order to attain the effect with Mn reduction, the Mn amount in the Fe—Ni alloy of the invention may be not more than 0.10%.

With regard to B (boron), if the invention alloy comprise a lot of B, it inhibits the formation of niobium nitrides by combination with nitrogen. Thus, preferably the amount of B is set to not more than 0.004%. On the other hand, boron has a shape-improving effect (i.e. an effect of preventing priority etching of grain boundaries) after etching step which is particularly effective in the case where the Mn amount is reduced. Thus, boron may be comprised in an amount of not less than 0.0001%.

While it is important to adjust niobium compounds in the invention, in order to obtain an optimum form thereof, desirably the amount of oxygen contained in the Fe—Ni or Fe—Ni—Co alloy is controlled to be, by mass proportion, not more than 100 ppm, more preferably not more than 50 ppm.

P (phosphorous) is an element of enhancing segregation during solidification and the segregation causes uneven etching. Thus, preferably it is limited to be not more than 0.015%.

Since sulfur (S) deteriorates hot workability of the alloy, it should be reduced as small as possible. Thus, preferably it is limited to be not more than 0.005%.

The present inventors examined also the size of niobium compounds effective for high-strengthening of the alloy by refining crystal grains. The invention Fe—Ni alloy has preferably an average crystal grain size of not less than 10 by the grain size number as defined in JIS G0551, which exhibits the effect of alloy strengthening. In this case, from the consideration of the relationship between a particle size of dispersed particles and an average crystal grain size of the matrix, which is led from the Zener's equation of $$R = \tfrac{4}{3} \times r/f^{2/3}$$

(where R is an average crystal grain size of the matrix, r is an average particle size of precipitates, and f is a volume rate of precipitates), it is desirable that the maximum grain size of niobium compounds (which are those primarily comprising Nb and nitrogen and other compounds primarily comprising Nb and carbon) observed at an fractional section of metal structure is less than 0.5 $\mu$m and a total number thereof at an fractional section of metal structure is not less than 50,000/mm$^2$.

Accordingly, in the invention Fe—Ni alloy, preferably, the maximum grain size of niobium compounds (which are of those primarily comprising Nb and nitrogen and other compounds primarily comprising Nb and carbon) is less than 0.5 $\mu$m, which can be observed at an fractional section of metal structure, and a total number of the compounds is not less than 50,000/mm$^2$ at an fractional section of metal structure. More preferably, the maximum grain size is not more than 0.3 $\mu$m and the total number of the compounds are not less than 50,000/mm$^2$, alternatively the maximum grain size is not more than 0.3 $\mu$m and the total number of the compounds is not less than 100,000/mm$^2$.

With regard to the ultra-fine niobium compounds of which maximum grain size is less than 0.5 $\mu$m can be adjusted, according to the chemical composition of the invention Fe—Ni alloy, for example, by controlling conditions of the solution, treatment (soaking) at 900° C. to 1350° C. and the precipitation treatment in the production process.

When measuring a grain size of niobium compounds observed at an fractional section of metal structure, it is possible to apply a method of observing niobium compounds appearing at a fractional structural surface etched by the speed method (i.e. Non-aqueous Electrolyte-Potentiostatic Etching Method (Selective Potentiostatic Etching by Electrolytic Dissolution: abridged as SPEED method)), for example. FIG. 1 is a photograph exhibiting a fractional structural surface of the Fe—Ni alloy etched by the speed method, which was observed with a scanning electron microscope at a magnification of 16,000× and from which niobium compounds having the maximum grain size of 0.06 $\mu$m can be seen. Noted is that it is possible to confirm the observed niobium compounds to be those primarily comprising Nb and nitrogen and those primarily comprising Nb and carbon on the basis of an analysis by the EDX (i.e. Energy Dispersive X-ray spectrometer) according to which grain's primarily comprising Nb and nitrogen or those primarily comprising Nb and carbon can be confirmed. The total number of the niobium compounds observed at an fractional section of metal structure may be determined by counting the number thereof observed at the fractional section and converting the number into number per 1 mm$^2$. In the case of FIG. 1, the number is 811×10$^4$/mm$^2$.

In the case of the prior art which relies on dispersion strengthening by crystallized compounds such as primarily niobium carbides, as described above, a considerably excess amount of additive Nb than about 0.1% is required and the crystallized compounds have a size of at smallest about 0.5 $\mu$m. In contrast, according to the present invention which aims for crystal grain refining by dissolving and precipitation of ultra-fine niobium compounds, since a necessary amount of Nb for achieving the aim is small as described below, crystallization of coarse niobium compounds, especially niobium nitrides can be restrained while the Nb amount can be also reduced.

EXAMPLE 1

With utilization of a vacuum induction melting furnace, Fe—36% Ni invar alloys were melted so as to have chemical compositions shown in Table 1, respectively, and ingots thereof were prepared. The ingots were subjected to the solution treatment by heating up to 1100° C., and subsequently to forging and hot rolling to produce plates having a thickness of 2.5 mm. After the plates were subjected to precipitation treatment for niobium compounds at 800° C. to 900° C., cold rolling and annealing were repeated to produce cold-rolled materials having a thickness of 0.1 mm.

Specimens were got from the finished cold-rolled materials, and the following values were measured, respectively:

an average grain size (i.e. the crystal grain size number as defined in JIS G0551), a grain size of the maximum niobium compounds (those primarily comprising niobium and nitrogen and those primarily comprising niobium and carbon), the total number of niobium compounds, 0.2% proof stress, and the thermal expansion coefficient.

The grain size of niobium compounds was measured with regard to a structural fraction surface of the respective specimen etched by the speed method, by observing the whole viewing field area of 500 $\mu m^2$ to be observed with utilization of a scanning electron microscope. The total number of niobium compounds was determined by counting and converting the number observed at the structural fraction surface. The 0.2% proof stress was measured at 20° C. The thermal expansion coefficient was measured at a temperature difference between 20° C. and 100° C. It should be noted that specimen No. 7 was not subjected to precipitation treatment and no niobium compound was observed therein.

carbides which were crystallized because of the much amount of carbon.

EXAMPLE 2

With utilization of a vacuum induction melting furnace, Fe—42% Ni invar alloys were melted so as to have chemical compositions shown in Table 2, respectively, and ingots thereof were prepared. The ingots were subjected to the solution treatment by heating up to 1100° C., and subsequently to forging and hot rolling to produce plates having a thickness of 2.5 mm. After the plates were subjected to precipitation treatment for niobium compounds at 800° C. to 900° C., cold rolling and annealing were repeated to produce cold-rolled materials having a thickness of 0.5 mm.

Specimens were got from the finished cold-rolled materials, and the following values were measured, respectively:

an average grain size (i.e. the crystal grain size number as defined in JIS G0551), a grain size of the maximum niobium compounds,

TABLE 1

| No. | Chemical Composition (% by mass), B,O (ppm), Solubility product (% Nb) × (% N) × $10^{-4}$ | | | | | | | | | | | Conditions of Precipitation Treatment |
|---|---|---|---|---|---|---|---|---|---|---|---|---|
| | C | Si | Mn | P | S | Ni | Nb | N | B | O | Fe | Nb · N | |
| 1 | 0.0032 | 0.015 | 0.22 | 0.0010 | 0.0002 | 35.85 | 0.02 | 0.0035 | — | 24 | Bal. | 0.70 | 800° C. × 10 h |
| 2 | 0.0056 | 0.032 | 0.29 | 0.0015 | 0.0004 | 35.92 | 0.04 | 0.0057 | 5 | 30 | " | 2.28 | 800° C. × 10 h |
| 3 | 0.0043 | 0.012 | 0.15 | 0.0024 | 0.0007 | 36.01 | 0.07 | 0.0110 | — | 17 | " | 7.70 | 900° C. × 4 h |
| 4 | 0.0062 | 0.023 | 0.31 | 0.0008 | 0.0008 | 35.89 | 0.06 | 0.0170 | 18 | 25 | " | 10.20 | 800° C. × 10 h |
| 5 | 0.0041 | 0.022 | 0.03 | 0.0038 | 0.0009 | 35.95 | 0.03 | 0.0062 | 32 | 45 | " | 1.86 | 800° C. × 10 h |
| 6 | 0.0064 | 0.028 | 0.24 | 0.0064 | 0.0010 | 35.98 | 0.19 | 0.0153 | — | 32 | " | 29.07 | 900° C. × 4 h |
| 7 | 0.0048 | 0.013 | 0.18 | 0.0024 | 0.0011 | 36.03 | — | 0.0015 | — | 18 | " | — | — |
| 8 | 0.0154 | 0.024 | 0.26 | 0.0021 | 0.0010 | 35.94 | 0.07 | 0.0065 | — | 28 | " | 4.55 | 900° C. × 4 h |

| No. | Niobium Compounds | | Grain Size (JIS) | 0.2% Proof Stress (N/mm$^2$) | Thermal Expansion Coefficient (× $10^{-6}$/° C.) | Remarks |
|---|---|---|---|---|---|---|
| | Size ($\mu$m) | Number (× $10^4$/mm$^2$) | | | | |
| 1 | 0.08 | 631 | 11 | 318 | 1.13 | Invention |
| 2 | 0.09 | 862 | 11 | 320 | 1.12 | Example |
| 3 | 0.12 | 921 | 10 | 312 | 1.15 | |
| 4 | 0.10 | 1042 | 11 | 327 | 1.16 | |
| 5 | 0.08 | 818 | 11 | 319 | 0.94 | |
| 6 | 3.5 | 1064 | 10 | 324 | 1.18 | Comparative |
| 7 | — | — | 8 | 287 | 1.24 | Example |
| 8 | 4.6 | 733 | 10 | 326 | 1.20 | |

*Column Nb or B: The letter "—" means that the element was not added, and the amount exceeding 1 ppm was not detected.
*No. 8: Niobium carbides, having a size of 4.6 $\mu$m, was crystallized.

In specimens No. 1 to 5 satisfying the requirements of the present invention, fine crystal grains of were obtained by finely precipitated niobium compounds. Specimens No. 1 to 5 have the proof stress improved by about 10%, respectively, as compared with the Nb-free specimen (No. 7), without deterioration of properties, such as the low thermal expansion property, required to shadow masks. On the other hand, specimen No. 6 comprising a much amount of Nb has improved 0.2% proof stress, but it was inferior in hot workability and etching property due to comparatively large niobium nitrides which were crystallized at a part where cooling rate was low during molding. Specimen No. 8 was inferior in etching property due to rather larger niobium the total number of niobium compounds, 0.2% proof stress, and a burr volume.

The burr volume is of a volume of burr extending from the punched edge of a specimen which was subjected to press-punching. It was measured in a plane parallel to the rolling direction within the length range of 350 $\mu$m. The 0.2% proof stress, the grain size and the total number of niobium compounds were measured according to the same mariner as stated in Example 1. It should be noted that specimen No. 14 was not subjected to precipitation treatment and no niobium compound was observed therein.

TABLE 2

| No. | Chemical Composition (% by mass), B,O (ppm), Solubility product (% Nb) × (% N) × $10^{-4}$ | | | | | | | | | | | Conditions of Precipitation Treatment |
|---|---|---|---|---|---|---|---|---|---|---|---|---|
|  | C | Si | Mn | P | S | Ni | Nb | N | B | O | Fe | Nb · N |  |
| 9 | 0.0075 | 0.14 | 0.45 | 0.0024 | 0.0005 | 41.00 | 0.01 | 0.0038 | — | 19 | Bal. | 0.38 | 800° C. × 10 h |
| 10 | 0.0081 | 0.09 | 0.42 | 0.0029 | 0.0007 | 41.09 | 0.04 | 0.0065 | — | 24 | " | 2.60 | 800° C. × 10 h |
| 11 | 0.0059 | 0.21 | 0.35 | 0.0015 | 0.0015 | 40.56 | 0.08 | 0.0120 | 21 | 10 | " | 9.60 | 900° C. × 4 h |
| 12 | 0.0065 | 0.14 | 0.59 | 0.0034 | 0.0012 | 41.08 | 0.06 | 0.0162 | 14 | 25 | " | 9.72 | 800° C. × 10 h |
| 13 | 0.0087 | 0.35 | 0.48 | 0.0008 | 0.0011 | 41.02 | 0.25 | 0.0192 | — | 32 | " | 48.00 | 900° C. × 4 h |
| 14 | 0.0012 | 0.11 | 0.59 | 0.0017 | 0.0008 | 40.68 | — | 0.0018 | — | 21 | " | — | — |

| No. | Niobium Compounds | | Grain Size (JIS) | 0.2% Proof Stress (N/mm$^2$) | Burr Volume ($\mu m^3$) | Remarks |
|---|---|---|---|---|---|---|
|  | Size ($\mu M$) | Number (× $10^4$/nm$^2$) |  |  |  |  |
| 9 | 0.07 | 353 | 11 | 302 | 1172 | Invention |
| 10 | 0.09 | 617 | 11.5 | 309 | 903 | Example |
| 11 | 0.14 | 988 | 11 | 314 | 802 |  |
| 12 | 0.12 | 1054 | 11 | 317 | 827 |  |
| 13 | 4.0 | 1543 | 11 | 323 | 755 | Comparative |
| 14 | — | — | 9 | 292 | 3620 | Example |

*Column Nb or B: The letter "—" means that the element was not added, and the amount exceeding 1 ppm was not detected.

Specimens No. 9 to 12 satisfying the requirements of the present invention have the 0.2% proof stress improved by finely precipitated niobium compounds, respectively. Further, by virtue of the finely precipitated niobium compounds, a break unit size (i.e. a size of each break section) at the punching face was decreased, so that the burr became smaller than that of the Nb-free specimen (No. 14). It is also noted that, since specimen No. 13 had crystallized coarse niobium nitrides due to a much amount of Nb, the wear of dies was increased when punching.

EXAMPLE 3

With utilization of a vacuum induction melting furnace, Fe—31% Ni—5%Co super invar alloys were melted so as to have chemical compositions shown in Table 3, respectively, and ingots thereof were prepared. The ingots were subjected to the solution treatment by heating up to 1100° C., and subsequently to forging and hot rolling to produce plates having a thickness of 2.5 mm. After the plates were subjected to precipitation treatment for niobium compounds at 800° C. to 900° C., cold rolling and annealing were repeated to produce cold-rolled materials having a thickness of 0.1 mm.

Specimens were got from the finished cold-rolled materials, and the following values were measured, respectively:

an average grain size (i.e. the crystal grain size number as defined in JIS G0551), a grain size of the maximum niobium compounds, the total number of niobium compounds, 0.2% proof stress, and the thermal expansion coefficient.

These were measured according to the same manner as stated in Example 1. It should be noted that specimen No. 20 was not subjected to precipitation treatment and no niobium compound was observed therein.

TABLE 3

| No. | Chemical Composition (% by mass), B,O (ppm), Solubility product (% Nb) × (% N) × $10^{-4}$ | | | | | | | | | | | | | Conditions of Precipitation Treatment |
|---|---|---|---|---|---|---|---|---|---|---|---|---|---|---|
|  | C | Si | Mn | P | S | Ni | Co | Nb | N | B | O | Fe | Nb · N |  |
| 15 | 0.0057 | 0.023 | 0.26 | 0.0032 | 0.0006 | 32.60 | 4.68 | 0.02 | 0.0041 | — | 16 | Bal. | 0.82 | 800° C. × 10 h |
| 16 | 0.0042 | 0.011 | 0.18 | 0.0028 | 0.0015 | 32.49 | 4.57 | 0.05 | 0.0063 | 4 | 14 | " | 3.15 | 800° C. × 10 h |
| 17 | 0.0062 | 0.032 | 0.22 | 0.0021 | 0.0004 | 32.52 | 4.49 | 0.08 | 0.0105 | 26 | 24 | " | 8.40 | 800° C. × 10 h |
| 18 | 0.0048 | 0.028 | 0.09 | 0.0027 | 0.0008 | 32.47 | 4.61 | 0.07 | 0.0175 | — | 25 | " | 12.25 | 900° C. × 4 h |
| 19 | 0.0055 | 0.025 | 0.29 | 0.0018 | 0.0012 | 32.51 | 4.50 | 0.24 | 0.0143 | — | 31 | " | 34.32 | 900° C. × 4 h |
| 20 | 0.0034 | 0.037 | 0.27 | 0.0013 | 0.0016 | 32.53 | 4.46 | — | 0.0018 | — | 16 | " | — | 900° C. × 4 h |
| 21 | 0.0202 | 0.017 | 0.34 | 0.0020 | 0.0011 | 32.48 | 4.58 | 0.09 | 0.0085 | — | 17 | " | 7.65 | 900° C. × 4 h |

| No. | Niobium Compounds | | Grain Size (JIS) | 0.2% Proof Stress (N/mm$^2$) | Thermal Expansion Coefficient (× $10^{-6}$/° C.) | Remarks |
|---|---|---|---|---|---|---|
|  | Size ($\mu m$) | Number (× $10^4$/mm$^2$) |  |  |  |  |
| 15 | 0.08 | 406 | 11 | 325 | 0.56 | Invention |
| 16 | 0.10 | 729 | 11 | 328 | 0.53 | Example |

TABLE 3-continued

| | | | | | | |
|---|---|---|---|---|---|---|
| 17 | 0.10 | 1035 | 11.5 | 330 | 0.51 | |
| 18 | 0.15 | 976 | 11 | 326 | 0.53 | |
| 19 | 4.5 | 1465 | 10.5 | 327 | 0.59 | Comparative |
| 20 | — | — | 8 | 294 | 0.58 | Example |
| 21 | 6.0 | 968 | 10.5 | 328 | 0.58 | |

*Column Nb or B: The letter "—" means that the element was not added, and the amount exceeding 1 ppm was not detected.
*No. 21: Niobium carbide, having a size of 6.0 μm, was crystallized.

In specimens No. 15 to 18 satisfying the requirements of the present invention, fine crystal grains of were obtained by finely precipitated niobium compounds. Specimens No. 15 to 18 have the proof stress improved by about 10%, respectively, as compared with the Nb-free specimen (No. 20), without deterioration of properties, such as the thermal expansion property. On the other hand, specimen No. 19 comprising a much amount of Nb was inferior in hot workability and etching property due to comparatively large niobium nitrides which were crystallized at a part where cooling rate was low during molding. Specimen No. 21 was inferior in etching property due to rather larger niobium carbides which were crystallized because of the much amount of carbon.

A Braun tube with a shadow mask made of any one of the specimen materials of the invention has an excellent color purity. Further, a semiconductor element with a lead frame made of any one of the specimen materials of the invention is excellent in high integration degree.

As will be apparent from the above, according to the invention, there is provided the Fe—Ni alloy having high strength and a small thermal expansion coefficient. Thus, when the invention alloy is applied to a shadow mask, because of easy handling thereof by virtue of high strength, it is possible to further reduce the thickness of the shadow mask, so that the shadow mask is suitable to the tensioning system as well as press-forming system and the production cost thereof can be reduced. In the case where the invention alloy is applied to a lead frame, the punching workability is improved by virtue of high strength, so that fine working and a high precision can be realized with regard to the geometrical form of product.

What is claimed is:

1. An Fe—Ni alloy having high strength and low thermal expansion, consisting essentially of, by mass percent, 30 to 50% of Ni, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002, \text{ and}$$

wherein the maximum grain size of compounds primarily comprising Nb and nitrogen and other compounds primarily comprising Nb and carbon is less than 0.5 μm, which can be observed in a section of the Fe—Ni alloy, wherein the total number of the compounds primarily comprising Nb and nitrogen and other compounds primarily comprising Nb and carbon is not less than 50,000/mm$^2$, which is determined by counting the total number of the niobium compounds observed in said section of alloy and converting the number into number per 1 mm$^2$.

2. An Fe—Ni alloy having high strength and low thermal expansion, consisting essentially of, by mass percent, 30 to 50% of Ni, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002,$$

and wherein an average grain size of the metal structure of the alloy is not less than 10 by the crystal grain size number as defined in JIS G0551.

3. An Fe—Ni alloy according to claim 1 to 2, having high strength and low thermal expansion, wherein the alloy comprises, by mass percent, not more than 0.10% of Mn.

4. An Fe-Ni alloy according to claim 1 or 2, having high strength and low thermal expansion, wherein the alloy comprises, by mass percent, not more than 0.004% of B.

5. An Fe—Ni alloy having high strength and low thermal expansion, consisting essentially of, by mass percent, 27 to 47% of Ni, not more than 22% of Co, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002,$$

wherein the maximum grain size of compounds primarily comprising Nb and nitrogen and other compounds primarily comprising Nb and carbon is less than 0.5 μm, which can be observed in a section of the Fe—Ni alloy, wherein the total number of the compounds primarily comprising Nb and nitrogen and other compounds primarily comprising Nb and carbon is not less than 50,000/mm$^2$, which is determined by counting the total number of the niobium compounds observed in said section of alloy and converting the number into number per 1 mm$^2$.

6. An Fe—Ni alloy having high strength and low thermal expansion, consisting essentially of, by mass percent, 27 to 47% of Ni, not more than 22% of Co, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ of Nb}) \times (\% \text{ N}) \leq 0.002, \text{ and}$$

wherein an average grain size of the metal structure of the alloy is not less than 10 by the crystal grain size number as defined in JIS G0551.

7. An Fe—Ni alloy according to claim 5 or 6, having high strength and low thermal expansion, wherein the alloy comprises, by mass percent, not more than 0.10% of Mn.

8. An Fe—Ni alloy according to claim 5 or 6, having high strength and low thermal expansion, wherein the alloy comprises, by mass percent, not more than 0.004% of B.

9. A shadow mask being made of the Fe—Ni alloy as defined in claim 1 or 2.

10. A Braun tube having the shadow mask as defined in claim 9.

11. A lead frame being made of the Fe—Ni alloy as defined in claim 1 or 2.

12. A semiconductor element having the lead frame as defined in claim 11.

13. A shadow mask being made of the Fe—Ni alloy as defined claim 5 or 6.

14. A Braun tube having the shadow mask as defined in claim 13.

15. A lead frame being made of the Fe—Ni alloy as defined in claim 5 or 6.

16. A semiconductor element having the lead frame as defined in claim 15.

17. An Fe—Ni alloy having high strength and low thermal expansion, consisting essentially of, by mass percent, 30 to 50% of Ni, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002,$$

wherein the maximum grain size of compounds primarily comprising Nb and nitrogen and other compounds primarily comprising Nb and carbon is less than 0.5 μm, which can be observed in a section of the Fe—Ni alloy, wherein the total number of the compounds primarily comprising Nb and nitrogen and other compounds primarily comprising Nb and carbon is not less than 50,000/mm$^2$, which is determined by counting the total number of the niobium compounds observed in said section of alloy and converting the number into number per 1 mm$^2$, and wherein an average grain size of the metal structure of the alloy is not less than 10 by the crystal grain size number as defined in JIS G0551.

18. An Fe—Ni alloy having high strength and low thermal expansion, consisting essentially of, by mass percent, 27 to 47% of Ni, not more than 22% of Co, 0.005 to 0.1% of Nb, less than 0.01% of C, 0.002 to 0.02% of N, and the balance of Fe and inevitable impurities, wherein the following equation is fulfilled:

$$0.000013 \leq (\% \text{ Nb}) \times (\% \text{ N}) \leq 0.002,$$

wherein the maximum grain size of compounds primarily comprising Nb and nitrogen and other compounds primarily comprising Nb and carbon is less than 0.5 μm, which can be observed in a section of the Fe—Ni alloy, wherein the total number of the compounds primarily comprising Nb and nitrogen and other compounds primarily comprising Nb and carbon is not less than 50,000/mm$^2$, which is determined by counting the total number of the niobium compounds observed in said section of alloy and converting the number into number per 1 mm$^2$, and wherein an average grain size of the metal structure of the alloy is not less than 10 by the crystal grain size number as defined in JIS G0551.

19. An Fe—Ni alloy according to one of claims 1, 2, 5, 6, 17 or 18, wherein the amount of N, by mass percent, is 0.002 to 0.01%.

20. An Fe—Ni alloy according to one of claims 1, 2, 5, 6, 17 or 18, wherein the Fe—Ni alloy contains, by mass percent, not more than 0.005% S.

21. An Fe—Ni alloy according to one of claims 1, 2, 5, 6, 17 or 18, wherein the amount of C, by mass percent, is less than 0.0081%.

* * * * *